United States Patent
Luff (10) Patent No.: US 7,724,080 B2
(45) Date of Patent: May 25, 2010

(54) CHOPPER STABILIZED AMPLIFIER

(75) Inventor: Gwilym Francis Luff, Great Shelford (GB)

(73) Assignee: Intersil Americas Inc., Milpitas, CA (US)

(*) Notice: Subject to any disclaimer, the term of this patent is extended or adjusted under 35 U.S.C. 154(b) by 1 day.

(21) Appl. No.: 12/144,384

(22) Filed: Jun. 23, 2008

(65) Prior Publication Data
US 2009/0309653 A1     Dec. 17, 2009

Related U.S. Application Data

(60) Provisional application No. 61/060,763, filed on Jun. 11, 2008.

(51) Int. Cl.
*H03F 1/02* (2006.01)
(52) U.S. Cl. .................................... 330/9; 327/124
(58) Field of Classification Search .............. 330/9; 327/124, 307
See application file for complete search history.

(56) References Cited

U.S. PATENT DOCUMENTS

| | | | |
|---|---|---|---|
| 3,174,111 A | 7/1961 | Grover | |
| 4,663,590 A | 5/1987 | Gershenson et al. | |
| 5,206,602 A * | 4/1993 | Baumgartner et al. | 330/9 |
| 5,486,790 A | 1/1996 | Huijsing et al. | |
| 6,456,159 B1 * | 9/2002 | Brewer | 330/9 |
| 7,132,883 B2 | 11/2006 | Huijsing et al. | |
| 7,209,000 B2 | 4/2007 | Huijsing et al. | |
| 7,292,095 B2 | 11/2007 | Burt et al. | |
| 7,336,123 B2 * | 2/2008 | Yoshida et al. | 330/9 |
| 7,425,821 B2 * | 9/2008 | Monreal et al. | 324/117 H |
| 7,589,587 B2 * | 9/2009 | Yoshida et al. | 330/9 |

FOREIGN PATENT DOCUMENTS

EP    0694229    7/2001

OTHER PUBLICATIONS

Horowitz et al., "The Art of Electronics," Chapter 7.07, pp. 415-417, Cambridge University Press (1989).
Thomsen et al., "A Five Stage Chopper Stabilized Instrumentation Amplifier Using Feed Forward Compensation," VLSI Circuits, Digest of Technical Papers, Jun. 11-13 (1998), pp. 220-223.

(Continued)

*Primary Examiner*—Henry K Choe
(74) *Attorney, Agent, or Firm*—Fliesler Meyer LLP (57) ABSTRACT

A chopper stabilized amplifier has differential inputs, an output, and a low frequency path and a high frequency path from the differential inputs to the output. Chopping occurs, at a chopping frequency, of a differential signal at differential inputs and outputs of an amplifier stage of the low frequency path to thereby produce a chopped differential signal that has a DC offset of the amplifier stage frequency shifted up to the chopping frequency. A continuous time filter embedded between a pair of further amplifier stages of the low frequency path is used to attenuate chopper frequency ripple resulting from the chopping at the chopping frequency. Additionally, a buffer is used to allow feedback through a compensation capacitor for the low frequency path, yet prevent chopper frequency ripple from feeding forward through the compensation capacitor to the output of the amplifier.

29 Claims, 12 Drawing Sheets

OTHER PUBLICATIONS

Hadiashar et al., "A Chopper Stabilized CMOS Analog Multiplier with Ultra Low DC Offsets," Proceedings of the 32nd European Solid-State Circuits Conference, Sep. 2006,pp. 364-367.

Witte, et al., "A CMOS Chopper Offset-Stabilized Opamp," IEEE Journal of Solid-State Circuits, vol. 42, No. 7 (Jul. 2007), pp. 1529-1535.

Burt et al., "A Micropower Chopper-Stabilized Operational Amplifier Using a SC Notch Filter With Synchronous Integration Inside the Continuous-Time Signal Path," IEEE Journal of Solid-State Circuits, vol. 41, No. 12 (Dec. 2006), pp. 2729-2736.

Enz et al., "Circuit Techniques for Reducing the Effects of Op-amp Imperfections: Autozeroing, Correlated Double Sampling, and Chopper Stabilization," Proceedings of the IEEE, vol. 84, No. 11 (Nov. 1996), pp. 1584-1614.

Eschauzier et al., "A 100-MHz 100-dB Operational Amplifier with Multipath Nested Miller Compensation Structure," IEEE Journal of Solid-State Circuits, vol. 27, No. 12 (Dec. 1992) pp. 1709-1717.

Eschauzier et al., "A Programmable 1.5 V CMOS Class-AB Operational Amplifier with Hybrid Nested Miller Compensation for 120 dB Gain and 6 MHz UGF," IEEE International Solid-State Circuits Conference (1994), vol. 29, No. 12 (Feb. 16-18, 1994), pp. 246-247.

ICL7650S datasheet, Intersil Corp. (www.intersil.com), Apr. 12, 2007.

ADI8551 datasheet, Analog Devices (www.analog.com), 2007.

Nolan E., "Demystifying Auto-Zero Amplifiers-Part 1," Analog Dialogue 34-2 (2000), pp. 1-3.

Huijsing J., "Instrumentation Amplifier Developments," AACD 2008 Proceedings, pp. 105-136.

* cited by examiner

CHOPPER STABILIZED AMPLIFIER

PRIORITY CLAIM

This application claims priority under 35 U.S.C. 119(e) to U.S. Provisional Patent Application No. 61/060,763, filed Jun. 11, 2008, which is incorporated herein by reference.

BACKGROUND

Figure 1A:
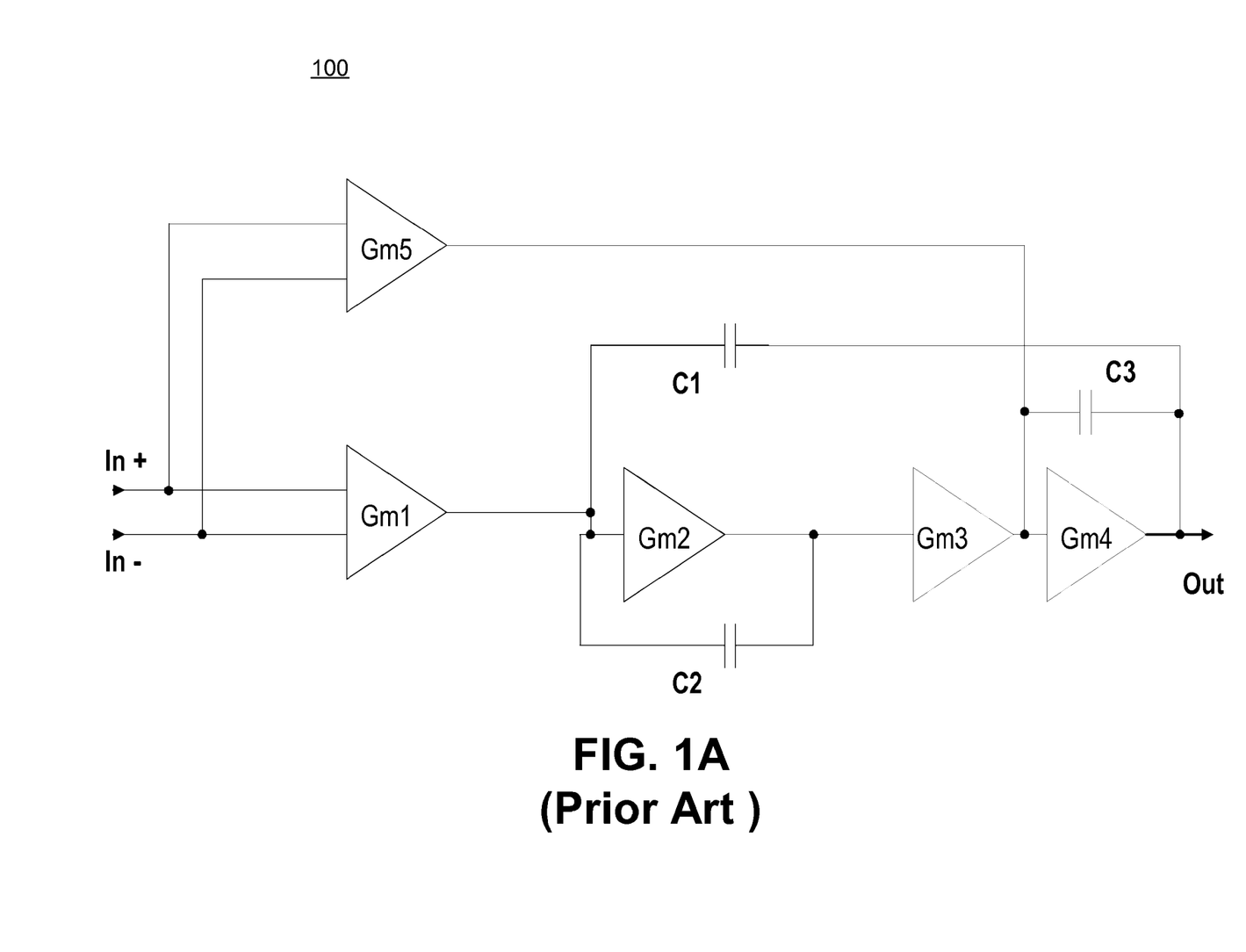
FIG. 1A shows a prior art multipath hybrid nested Miller compensation amplifier.

FIG. 1A shows a multipath hybrid nested Miller compensation amplifier 100 disclosed in FIG. 11 of an article by Eschauzier et al, entitled "A programmable 1.5 V CMOS class-AB operational amplifier with hybrid nested Miller compensation for 120 dB gain and 6 MHz UGF," Solid-State Circuits, IEEE Journal of, Volume 29, Issue 12, Dec. 1994 Pages: 1497-1504. The amplifier 100 is a multistage amplifier, combining both forward nesting (C2) and backward nesting (C3) of inner Miller feedback inside the outer Miller compensation loop (C1). Both C2 and C3 are at the same nesting level, so the design equations are similar to the singly nested multipath Miller amplifier disclosed in an article by Eschauzier et al., entitled "A 100-MHz 100-dB operational amplifier with multipath nested Miller compensation structure," Solid-State Circuits, IEEE Journal of Volume 27, Issue 12, December 1992 Pages: 1709-1717.

Figure 1B:
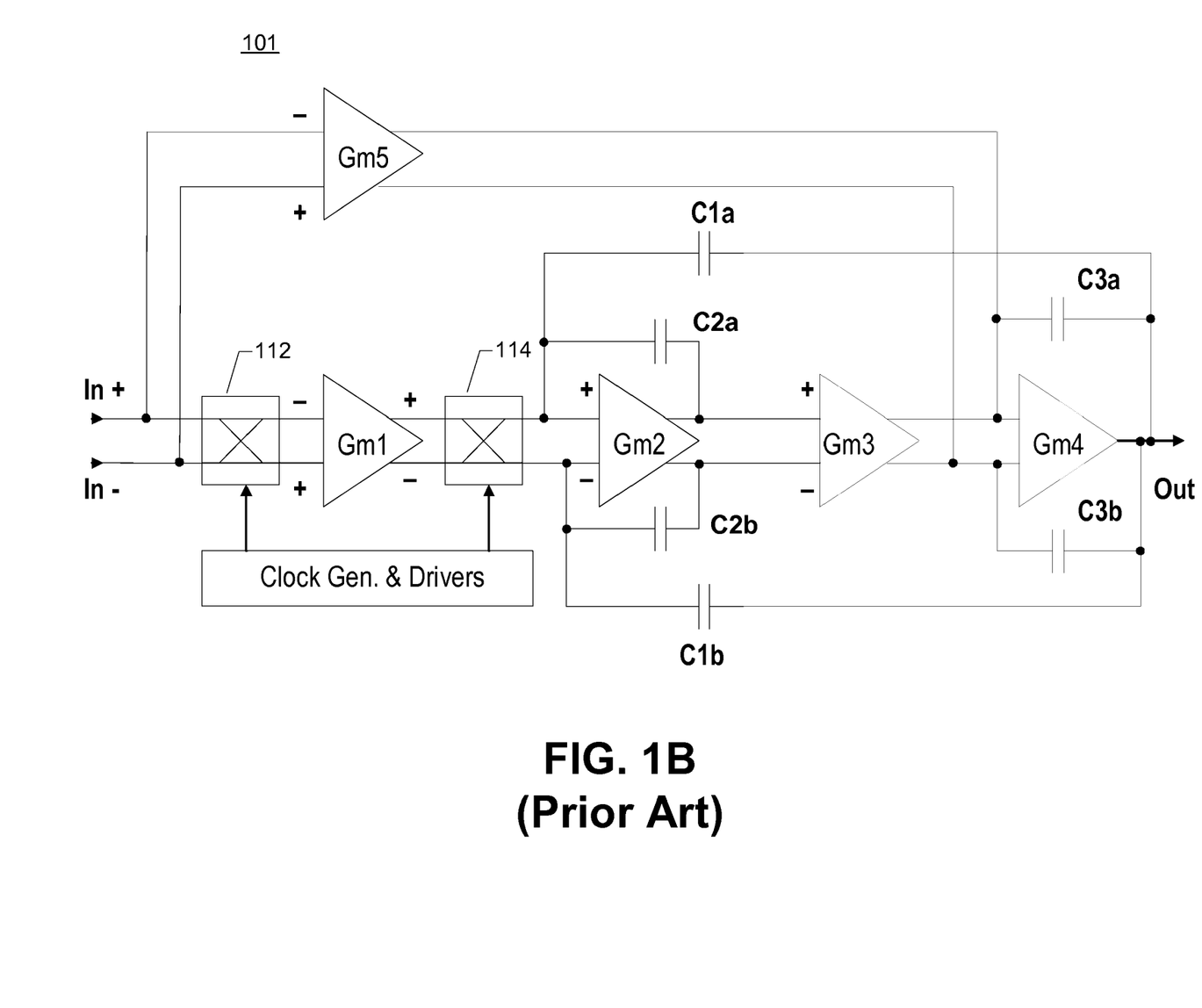
FIG. 1B shows a prior art multipath hybrid nested Miller compensation amplifier with chopper stabilization.

A problem with the amplifier 100 is that DC offsets in amplifier stage Gm1 adversely affect the output of the amplifier 100. As shown in FIG. 1B, choppers 112 and 114 can be placed at the input and output of Gm1 to attenuate such DC offsets. To facilitate chopping, the output of Gm1 is made differential, Gm2 is given a differential input, and the Miller compensation capacitor C1 is split into C1a and C1b. The resulting amplifier 101 of FIG. 1B is the same as the circuit shown in FIG. 7.1 of an Article by Huijsing entitled "Instrumentation Amplifier Developments" AACD 2008 Proceedings, 2008 Pages: 105-119. Referring to FIG. 1B, the chopper 112 at the input of Gm1 frequency shifts the input signal up to the chopping frequency. The chopper 114 at the output of Gm1 shifts the signal back to baseband, but DC offset and 1/f noise from Gm1 remain frequency shifted up to the chopping frequency.

SUMMARY OF THE INVENTION

In accordance with an embodiment of the present invention, an amplifier includes differential inputs, and an output, with a low frequency path and a high frequency path between the differential inputs and the output of the amplifier. Choppers within the low frequency path chop, at a chopping frequency, a differential signal at differential inputs and outputs of a first amplifier stage to produce a chopped differential signal that has a DC offset of the first amplifier stage frequency shifted up to the chopping frequency. A continuous time filter embedded between second and third amplifier stages, within the low frequency path, attenuate chopper frequency ripple resulting from the chopping at the chopping frequency. An output of the third amplifier stage is connected to the output of the amplifier, directly, or through one or more further amplifier stage.

In accordance with an embodiment, an input of a buffer is connected to the output of the amplifier. Also, a compensation capacitor is connected between one of the differential inputs of the second amplifier stage and the output of the buffer. This buffer allows feedback through the compensation capacitor, yet prevents chopper frequency ripple from feeding forward to the output of the amplifier through the compensation capacitor.

Further and alternative embodiments, additional details, and the features, aspects, and advantages of the various embodiments of invention will become more apparent from the detailed description set forth below, the drawings and the claims.

DETAILED DESCRIPTION

A problem with the amplifier 101 in FIG. 1B is that the DC offset and 1/f noise contribution of amplifier stage Gm1 appear as a square wave current at the output of the chopper at the output of Gm1. This current feeds forward to the output of the amplifier 101 and appears as an undesirable chopping frequency ripple at the output of the amplifier 101. More specifically, the chopper frequency ripple takes two paths to the output. The first is through Gm2, Gm3 and Gm4. The second path is through C1a direct to the output. The finite transconductance of Gm4 allows the square wave current through C1a to produce a square wave ripple at the amplifier output. Specific embodiments of the present invention, described below, filter out the undesirable chopper frequency ripple just described.

Figure 2A:
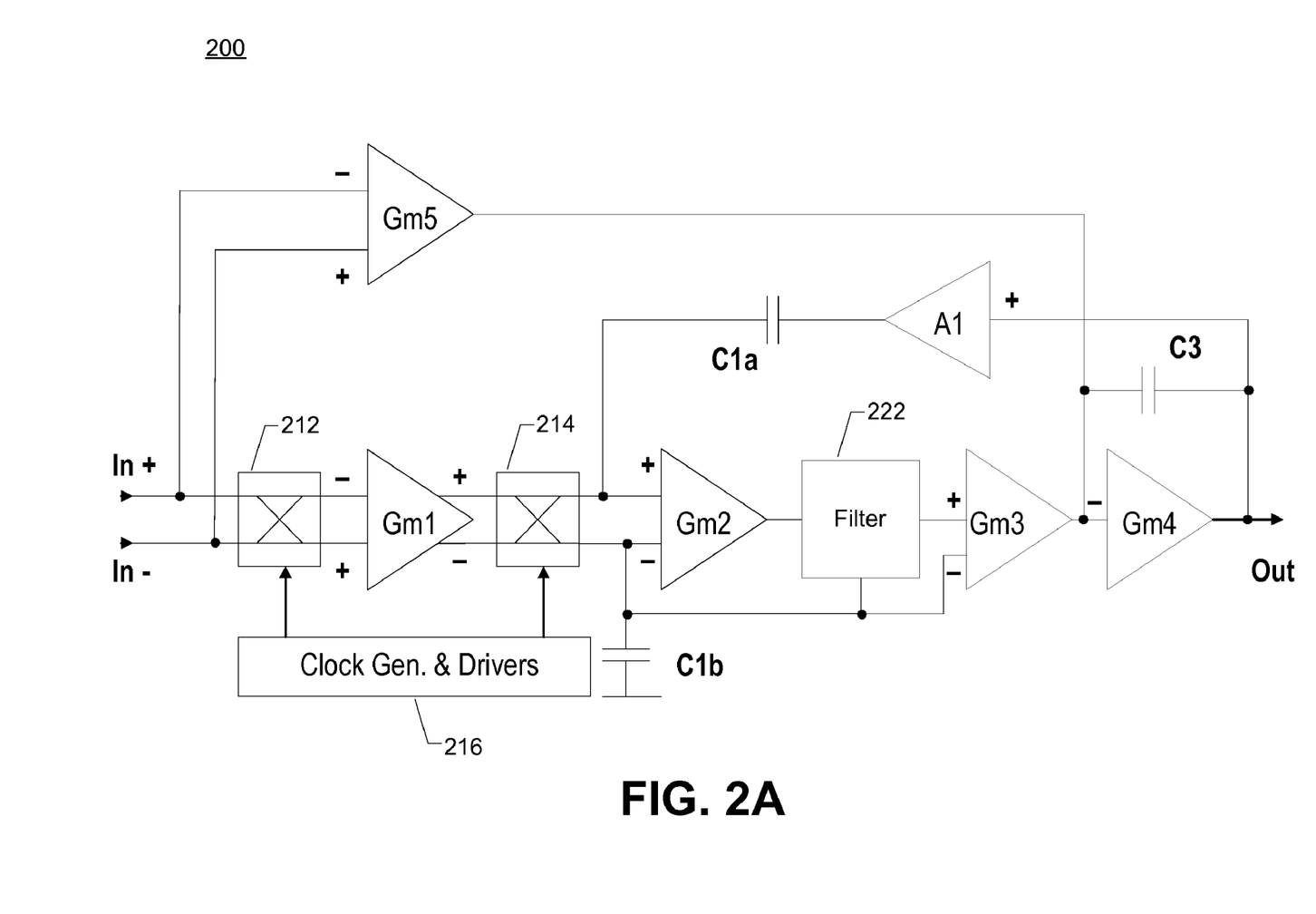
FIG. 2A shows a chopper stabilized amplifier, in accordance with an embodiment of the present invention.

FIG. 2A shows a chopper stabilized amplifier 200, in accordance with an embodiment of the present invention. The amplifier 200 includes a number of amplifier stages, including an input amplifier stage Gm1 that has differential inputs and complimentary differential outputs, intermediate amplifier stages Gm2 and Gm3, an output amplifier stage Gm4, and a further input amplifier stage Gm5. Additionally, the amplifier 200 includes a filter 222 between the intermediate amplifier stages Gm2 and Gm3, a buffer A1, and capacitors C1a, C1b and C3. In accordance with an embodiment, the notch filter 222 is a continuous time notch filter. Additional details of the filter 222, according to specific embodiments of the present invention, are discussed below with reference to FIGS. 3A, 3B and 4. Additional details of the buffer A1, according to an embodiment of the present invention, are discussed below with reference to FIG. 5. In accordance with an embodiment, each of the amplifier stages Gm1, Gm2, Gm3, Gm4 and Gm5 is a transconductance amplifier (TA). More specifically, Gm1, Gm2, Gm3, Gm4 and Gm5 can each be an operational transconductance amplifier (OTA).

Still referring to FIG. 2A, the amplifier 200 also includes an input chopper 212 at the differential inputs of the input amplifier stage Gm1, and an output chopper 214 at the complimentary differential outputs of the input amplifier stage Gm1. The input chopper 212 frequency shifts the input signal (received at the differential inputs of the amplifier 200) up to the chopping frequency. The output chopper 214 shifts the signal back to baseband. Additionally, the choppers 212 and 214 frequency shift up the DC offset and 1/f noise contribution of the input amplifier stage Gm1 to the vicinity of the chopping frequency (e.g., 100 KHz). Between the two choppers 212 and 214 the wanted signal is in small frequency bands surrounding the chopping frequency and its harmonics. The output chopper 214 should frequency translate all the DC offset and 1/f noise. Additionally, the drive signals provided to the choppers 212 and 214 should have precise symmetry.

The frequency shifted up DC offset and 1/f noise contribution appears as a square wave current at the output of the output chopper 214, and thus, at the input to the intermediate amplifier stage Gm2. This current, which includes chopping frequency ripple, has two possible forward paths to the output of the amplifier 200, including a first path through capacitor C1a, and a second path through the intermediate amplifier stages Gm2 and Gm3. Such chopping frequency ripple may also referred to as 'artifacts' or 'spurious signals' at the chopping frequency, or as chopper frequency ripple.

In accordance with an embodiment, the first path through capacitor C1a is broken by the buffer A1, thereby preventing the chopping frequency ripple from feeding forward to the output of the amplifier 200. Stated another way, the buffer A1 absorbs the error current (at the chopping frequency) coming through the capacitor C1a. In accordance with an embodiment, the buffer A1 is a unity gain rail-to-rail buffer that can produce an output that can go to within a few millivolts of the high and low voltage rails. Exemplary details of the buffer A1, according to an embodiment of the present invention, are provided in FIG. 6.

In accordance with an embodiment of the present invention, the filter 222 embedded between the intermediate amplifier stages Gm2 and Gm3 significantly attenuates (preferably to microvolt levels) the chopping frequency ripple without disturbing the overall loop gain and phase characteristics of the amplifier 200. The significant attenuation of the chopping frequency ripple may also be referred to as 'filtering out' the chopping frequency ripple.

The amplifier stages Gm1, Gm2, Gm3 and Gm4 collectively provide what may be referred to as a four stage low frequency path, or simply a low frequency path. The amplifier stages Gm5 and Gm4 collectively provide what may be referred to as a two stage high frequency path, or simply a high frequency path. The two stage high frequency path has a relatively high bandwidth relative to the four stage low frequency path. For example, the two stage high frequency path can have a 500 KHz bandwidth, and the four stage low frequency path can have a 5 KHz bandwidth. The four stage low frequency path takes over from the two stage high frequency path at the cross-over frequency. More specifically, the two stage high frequency path handles frequencies above the cross-over frequency, and the four stage low frequency path handles frequencies below the cross-over frequency.

FIG. 2A also shows a clock generator and drivers block 216, which can also be referred to as a clock source. The clock source may be internal to, or external to, the amplifier 200. A clock generator may be implemented, e.g., by an RC oscillator. For example, a chopping clock can be generated by a 200 KHz RC oscillator, and then divided by two, to provide a 100 KHz chopping frequency. Chopping switches within the choppers 212 and 214 can be driven, e.g., by slew rate controlled non overlapping clock drivers—one level shifted up to full supply range for the input chopper 212, the other at low Vdd for the output chopper 214. These are just examples, which are not meant to be limiting.

In accordance with an embodiment, the transconductance (Gm) of the intermediate amplifier stages Gm2 and Gm3 is about 1/100th of the transconductance of the input amplifier stage Gm1 and the input amplifier stage Gm5. This provides for an increased time constant of the inner integrators (C2/Gm2 and C3/Gm3), so that they provide significant attenuation at the chopping frequency. The low Gm of the intermediate amplifier stages Gm2 and Gm3 also reduces the current drain of the intermediate amplifier stages Gm2 and Gm3. The open loop voltage gain of the intermediate amplifier stage Gm3 is reduced because it is loaded by the larger output conductance of input amplifier stage Gm5. However, this gain shortfall can be made up by the voltage gain of the intermediate amplifier stage Gm2.

Figure 2B:
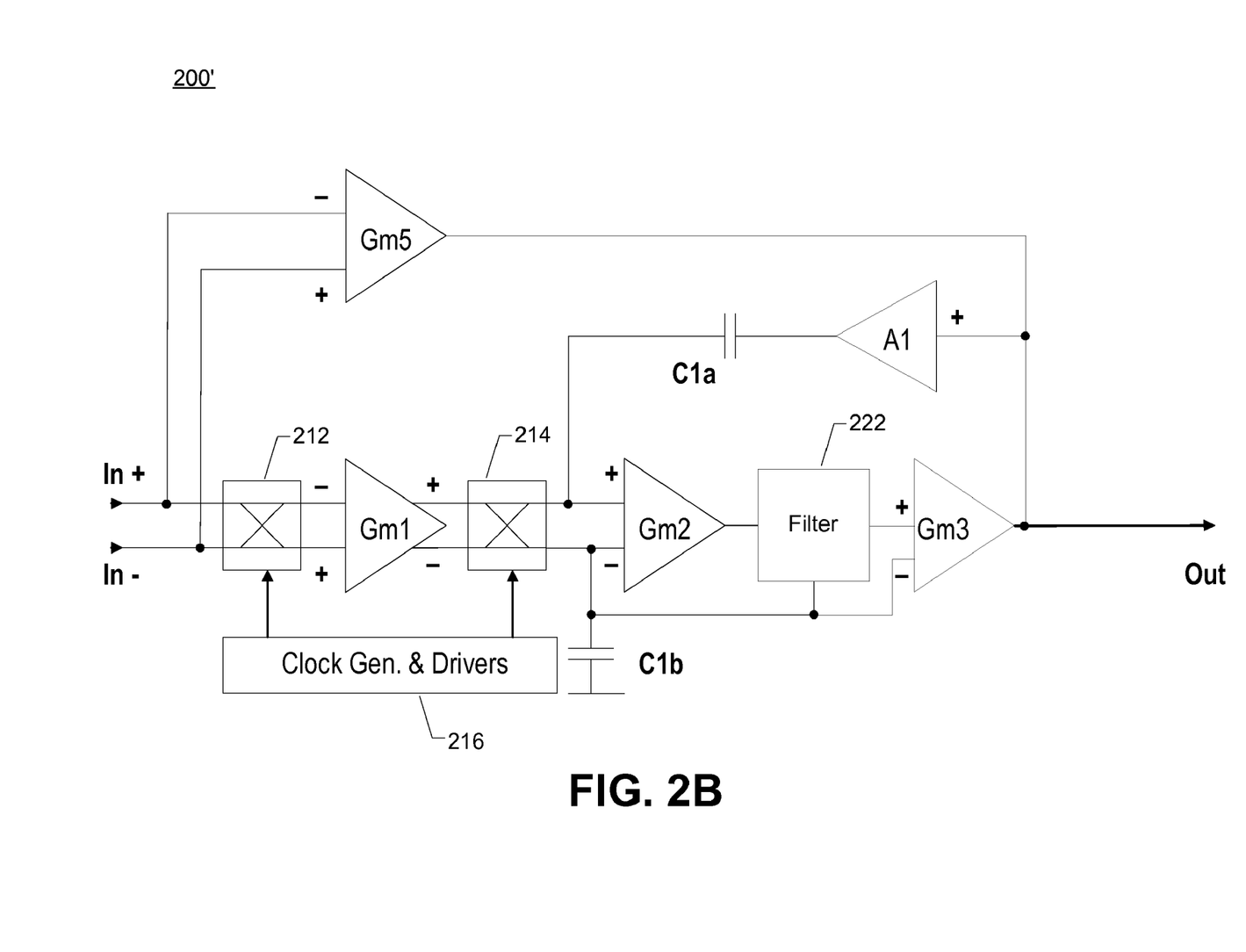
FIG. 2B shows a chopper stabilized amplifier, according to a further embodiment of the present invention.
Figure 2C:
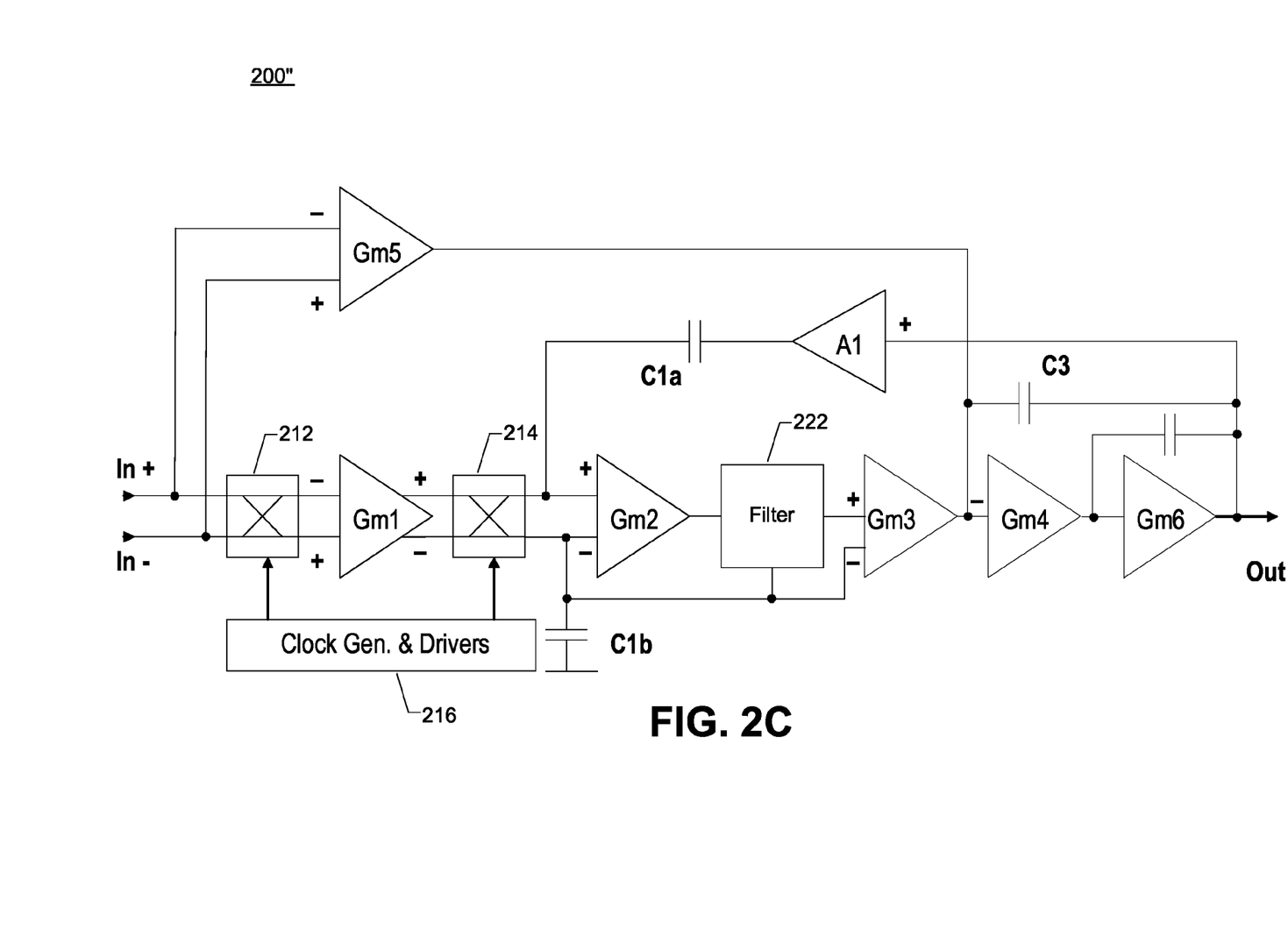
FIG. 2C shows a chopper stabilized amplifier, according to another embodiment of the present invention.
Figure 2D:
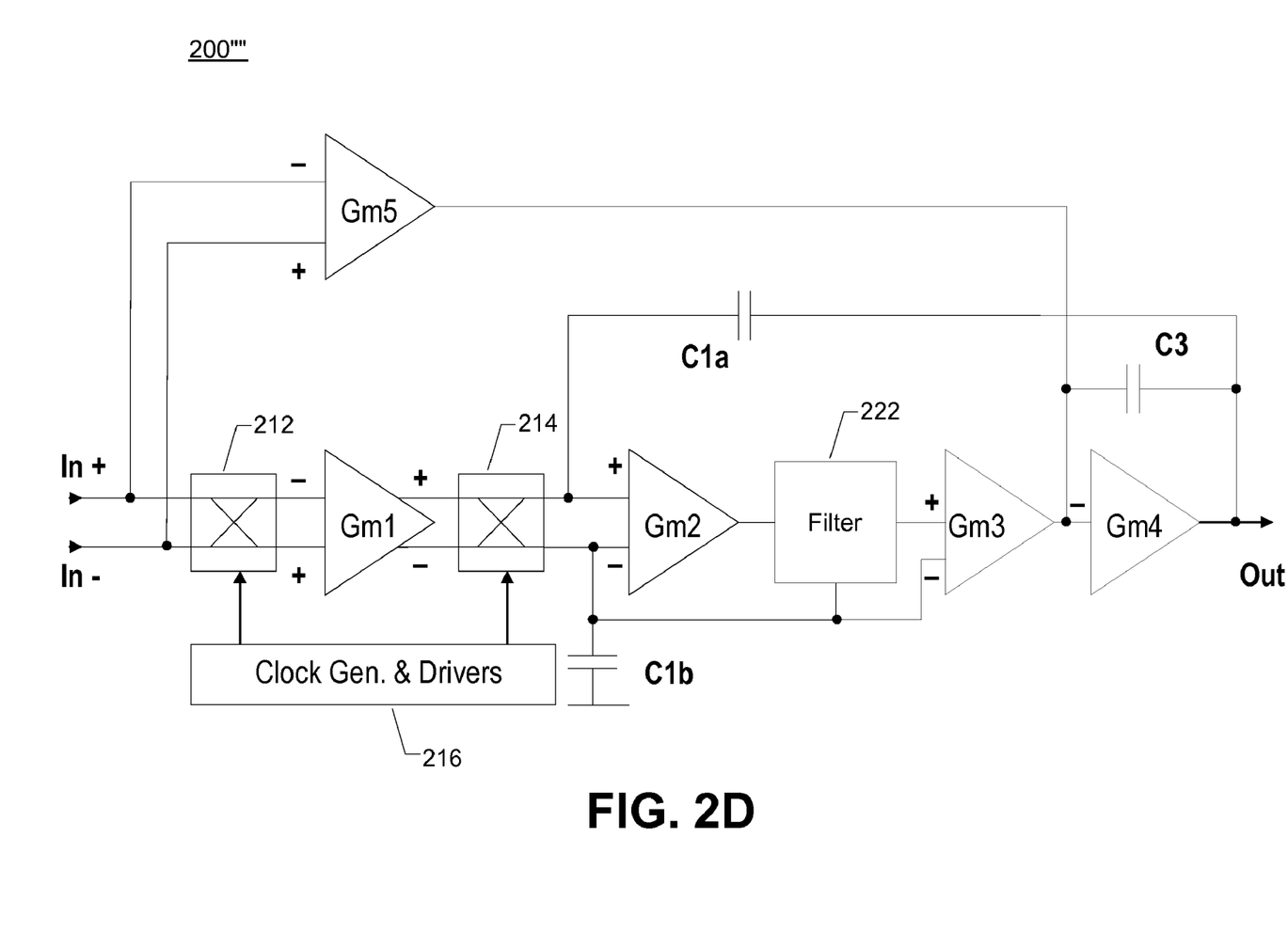
FIG. 2D shows a chopper stabilized amplifier, according to yet another embodiment of the present invention.

FIG. 2A shows what can be referred to as a four-stage multi-path amplifier, since there are four Gm stages (i.e., four transconductance stages) along the longest path from the input to the output. FIG. 2B shows a three-stage multi-path amplifier 200', according to an embodiment of the present invention, which includes three Gm stages along the longest path from the input to the output. In FIG. 2B, the only amplifier stage in the high frequency path is Gm5. Accordingly, in FIG. 2B, Gm5 is both an input and output amplifier stage for the high frequency path. Further, in FIG. 2B, amplifier stage Gm3 is the output amplifier stage for the low frequency path. FIG. 2C shows a five-stage multi-path amplifier 200", according to another embodiment of the present invention, which includes five Gm stages along the longest path from the input to the output. As can be appreciated from these figures, additional Gm stages can be added, if desired, and still be within the scope of the present invention. FIG. 2D shows that the buffer A1 in FIG. 2A can be replaced with a short circuit. While the circuit of FIG. 2D may not provide as much filtering out of the chopping frequency ripple as the circuit of FIG. 2A, the filter 222 on its own will still provide significant benefits. Similarly, in FIGS. 2B and 2C, the buffer A1 can be replaced with a short circuit. Nevertheless, it is beneficial to also utilize the buffer A1 in each of these circuits, to maximize the attenuation of the chopping frequency ripple. Unless explained otherwise, the amplifiers in FIGS. 2A-2D will collectively be referred to as the amplifier 200. Further, unless stated otherwise, the amplifier 200 will be presumed to include both the filter 222 and the buffer A1.

Figure 3A:
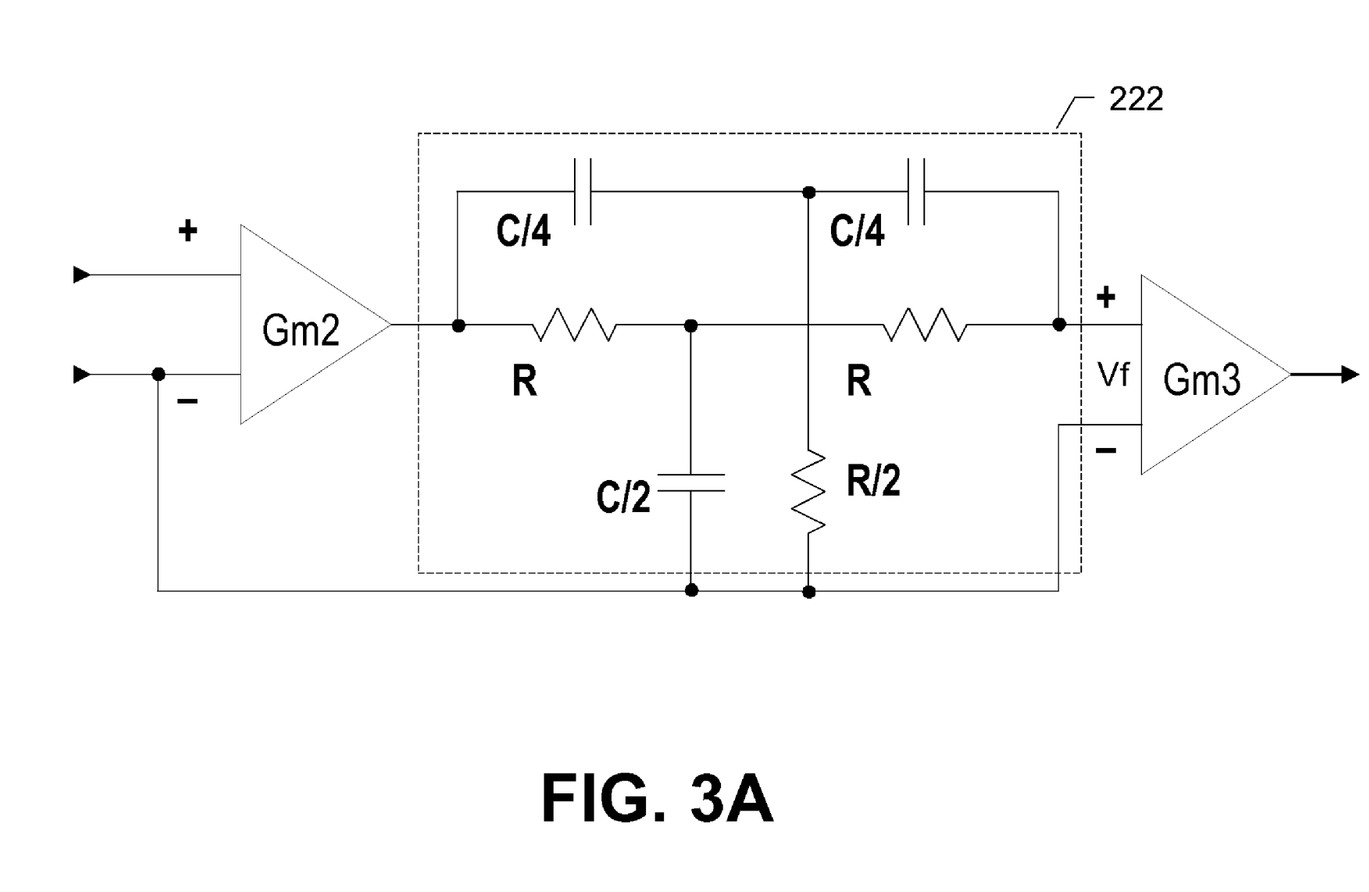
FIG. 3A shows how the filter in FIGS. 2A-2D can be implemented between the amplifier stages Gm2 and Gm3 of the amplifiers of FIGS. 2A-2D, in accordance with an embodiment of the present invention.
Figure 4:
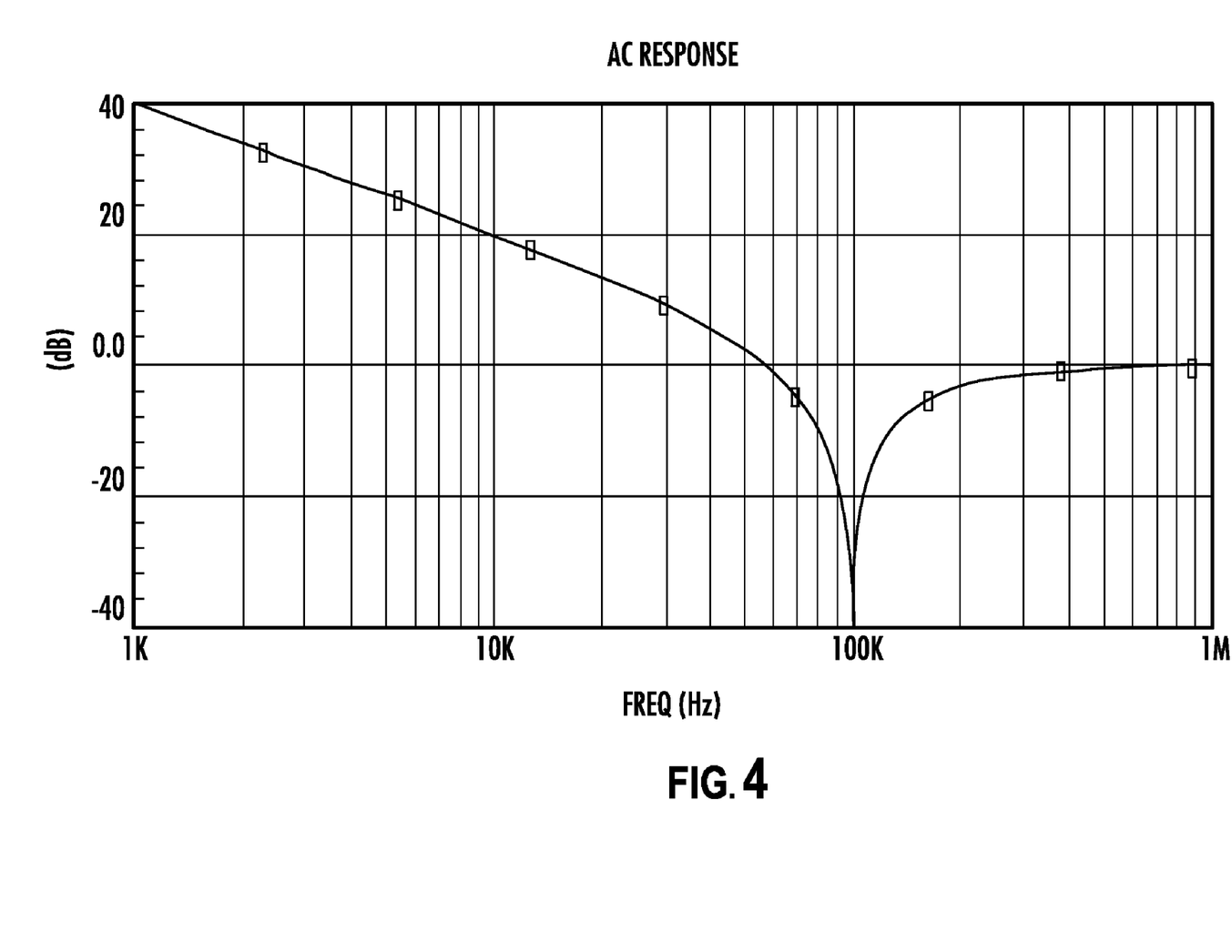
FIG. 4 shows an exemplary frequency response of the notch filter shown in FIG. 3A for a unit current input.

FIG. 3A shows how the filter 222 of the amplifier 200 can be implemented as a notch filter in the forward path between the amplifier stages Gm2 and Gm3, in accordance with an embodiment of the present invention. More specifically, FIG. 3A shows how the filter 222 can be implemented as a twin-T notch filter that includes a pair of resistors R, a pair of capacitors C/4, a resistor R/2, and a capacitor C/2. The notch frequency of the twin-T filter is a function of the values of the resistors and capacitors. The output is taken pseudo-differentially across the twin-T output terminals to maintain the attenuation of the notch. When fed by a current source, a twin-T notch filter network with an open circuit load acts as an integrator below the notch frequency, and as a resistor above that frequency. Accordingly, the twin-T notch filter, which receives a current output by the intermediate amplifier stage Gm2, acts as an integrator at frequencies below the notch frequency, e.g., as shown in the exemplary frequency response curve of FIG. 4. Still referring to FIG. 3A, a current at the 'common terminal' of the twin-T notch filter is returned to the inverting input of the intermediate amplifier stage Gm2, to provide a Miller feedback path that splits poles at the input and output of the intermediate amplifier stage Gm2. Further, by returning the twin-T notch filter to capacitor C1b, a quieter signal return at higher frequencies is provided.

As mentioned above, the notch frequency of the twin-T notch filter is a function of the values of the resistors and capacitors. As also mentioned above, the clock generator that provides a clock signal to the choppers may be produced by an RC oscillator, in which case the frequency of the clock signal is also a function of the values of resistors and capacitors. In both cases, the resistor and capacitor values can vary due to process variations. Accordingly, if the amplifier 200 includes the clock source, the circuit can be designed so that the chopping clock frequency and twin-T notch frequency can track over process and temperature variations. In an application where an externally supplied clock is used, it would be useful to allow for adjustment of the resistance and/or capacitance values in the twin-T notch filter (and/or the external clock source), so that the notch frequency can be matched to the clock frequency.

Figure 3B:
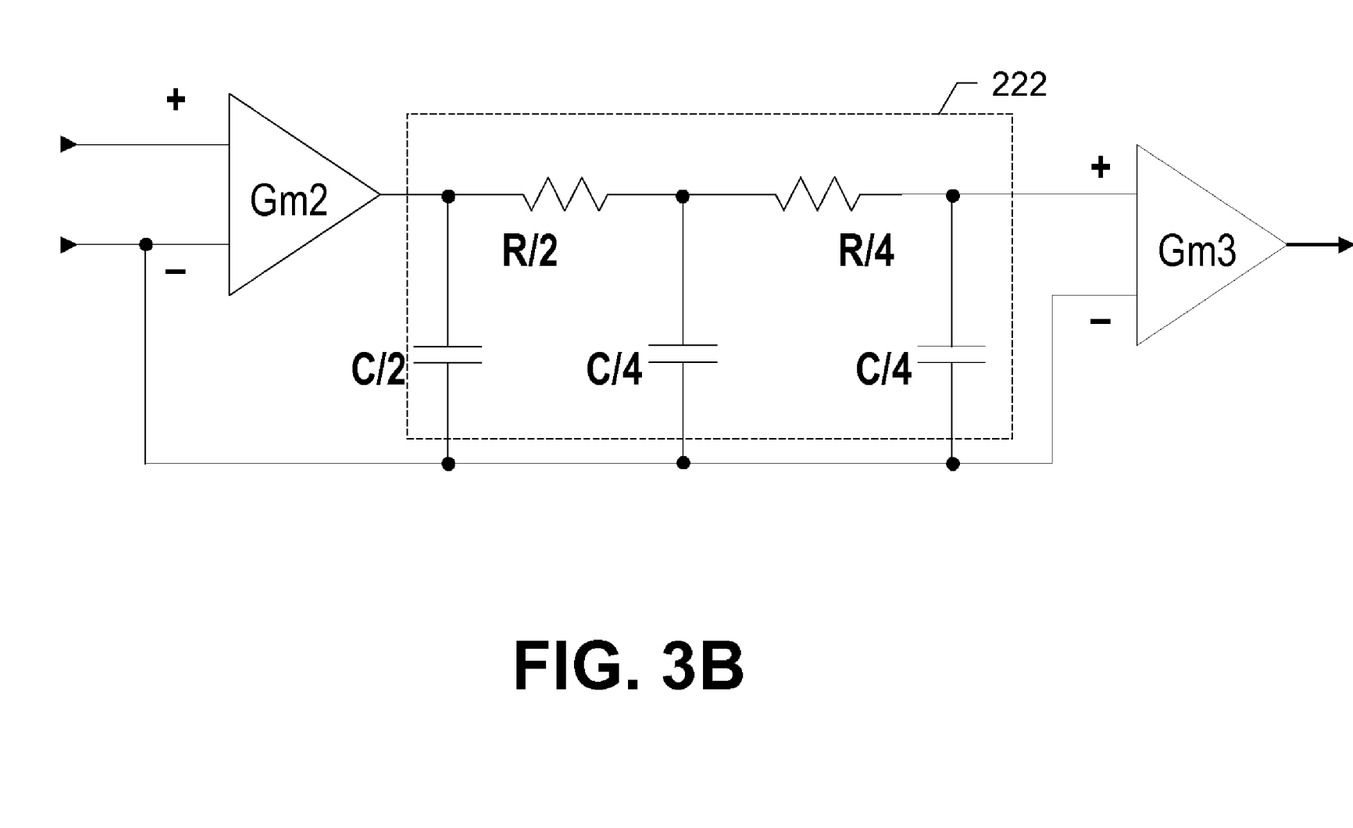
FIG. 3B shows an alternative way in which the filter in FIGS. 2A-2D can be implemented between the amplifier stages Gm2 and Gm3 of the amplifiers of FIGS. 2A-2D, in accordance with an embodiment of the present invention.

It is noted that alternative three terminal filters can be used in place of the twin-T notch filter of FIG. 3A, with the current at the 'common terminal' of such filters being provided to the inverting input of the intermediate amplifier stage Gm2, and to the inverting input of the amplifier stage Gm3. Accordingly, use of such alternative filters are also within the scope of the present invention. Such an alternative filter can also be a notch filter, or can be a low pass filter, an example of which is shown in FIG. 3B. The exemplary three terminal low pass filter shown in FIG. 3B includes two resistors, and three capacitors. Alternative low pass filters may also be used. A low pass filter may be useful, e.g., if the chopping frequency is not well controlled and could thus 'wander' outside the confines of a narrow notch. However, a low pass filter will provide less attenuation of the chopping frequency ripple. Thus, if the chopping frequency is well controlled, it may be advantageous to use a notch filter.

In accordance with specific embodiments, the twin-T notch filter of FIG. 3A, the three terminal low pass filter of FIG. 3B, or an alternative three terminal filter, is a continuous time filter, which is advantageous because a continuous time filter does not require complex clocking strategies with critical timing requirements. Further, because there is no switching element at the output of a continuous time filter, there is not a path for clock frequency interference from the filter to the output of the amplifier 200.

Still referring to FIG. 3A, an 'offset correction' voltage Vf can be identified, which is the voltage at the output of the twin-T filter. In equilibrium this voltage opposes the input offset voltage of the input amplifier stage Gm5, with Vf= (Gm5/Gm3)*Vos5, where Vos5 is the input offset voltage of input amplifier stage Gm5.

Referring back FIG. 2A, to further explain the operation of the amplifier 200 it is useful to explain the function of different parts of the circuit over frequency. There are three key frequencies in the design, including the unity gain bandwidth (UGBW), the chopping frequency, and the crossover frequency. The UGBW is set by the input amplifier stage Gm5 and the outer Miller capacitor C3. For example, the UGBW can be set to 500 KHz. The chopping frequency is set by the clock signal that controls the chopping switches of the choppers 212 and 214. In accordance with an embodiment, the chopping frequency is set low enough to minimize DC errors due to charge injection, but as high as possible for ripple rejection. For example, if the UGBW is 500 KHz, then the chopping frequency can be 100 KHz, which is below the UGBW, but above the useful signal bandwidth of 0 to 10 KHz. As mentioned above, the crossover frequency is the frequency below which the low frequency path (including amplifier stages Gm1, Gm2, Gm3 and Gm4) takes over from the high frequency path (including amplifier stages Gm5 and Gm4). The crossover frequency in FIG. 2A is set by the ratios of Gm2/Cf and Gm3/C3, where Cf is the total capacitance of the filter 222. For example, the crossover frequency can be set to 5 KHz to give a good roll-off of the chopping frequency ripple. In accordance with an embodiment, the low frequency path provides the >150 dB low frequency gain useful for microvolt DC accuracy, and the high frequency path provides a 500 KHz unity gain bandwidth and all the gain above the crossover frequency. Use of alternative UGBW, alternative chopping and crossover frequencies, and alternative gains are within the scope of the present invention.

In accordance with an embodiment, the buffer A1 is a rail-to-rail unity gain voltage buffer that absorbs an error current (at the chopping frequency) coming through capacitor C1a. More specifically, the buffer A1 isolates the output of the amplifier 200 from the outer Miller capacitor C1a, to prevent the chopping frequency ripple of the input amplifier stage Gm1 from feeding through the capacitor C1a to the output of the amplifier 200.

Figure 5:
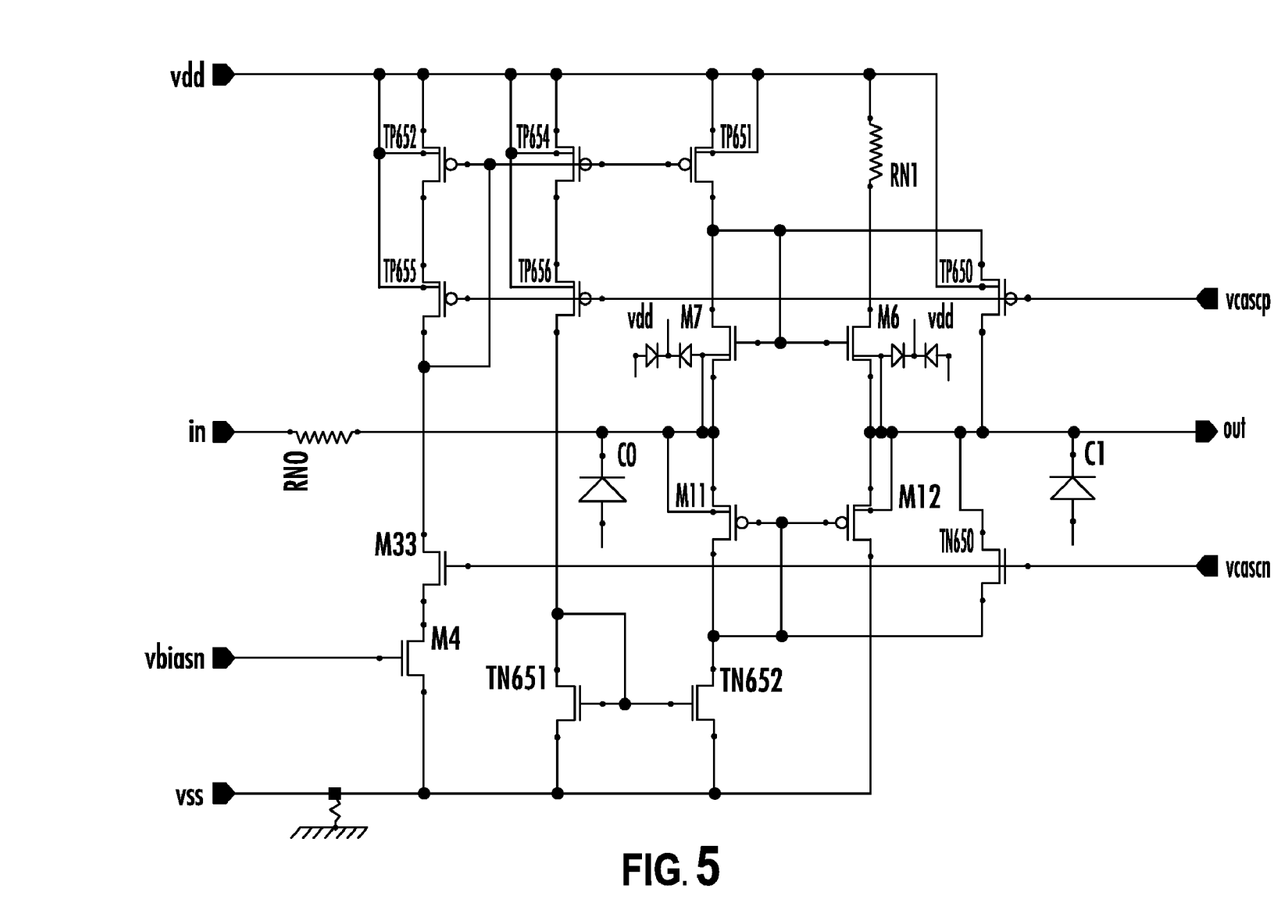
FIG. 5 shows details of how the buffer A1 of FIGS. 2A-2C can be implemented, in accordance with an embodiment of the present invention.

FIG. 5 shows details of how the buffer A1 of FIGS. 2A-2C can be implemented as a low-offset rail-to-rail unity gain voltage buffer, in accordance with an embodiment of the present invention. A useful features of the buffer A1 circuit shown in FIG. 5 is that the input level shift devices M7 and M11 are diode connected devices, rather than source followers. This reduces the offset voltage, as the Vgs of NFETs M7 and M6 track, as do the Vgs of PFETs M11 and M12. In the circuit of FIG. 5, the bias current in M7 and M11 is drawn from the input of the buffer A1. When used in the amplifier 200, this point (i.e., the input of the buffer A1) is fed by the output amplifier stage Gm4 of the amplifier 200, which can source and sink this current. Another useful feature of the buffer A1 circuit shown in FIG. 5 is that the common gate devices TP650 and TN650 extend the output voltage swing. As is usual with complementary followers, as the input approaches the positive rail, the current source TP651 runs out of headroom and the devices M7 and M6 become ineffective. In this circuit, as the gate voltage of M7 and M8 approaches the supply, the common gate device TP650 conducts, supplying a bias current to the PMOS follower M12. Device M12 continues to follow the input voltage until the current source TP651 collapses. TN650 acts similarly when the input approaches the negative rail. The bias current in M7 and M11 becomes the pull-up and pull-down current near the supply voltage, so the bias current should be substantial. In accordance with an embodiment, the level shifter bias current is equal to the output follower bias current. The circuit has a high current driving capability in the middle range when it acts as a class AB complementary follower. When the voltage approaches the supply rail, the circuit acts as a standard source follower, with a driving capability limited by the bias current.

Use of alternative circuits for buffer A1 are also within the scope of the present invention. Further, while the buffer A1 has been described as having unity gain, in alternative embodiments the buffer A1 can have a non-unity gain, and still be within the scope of the present invention.

Figure 6:
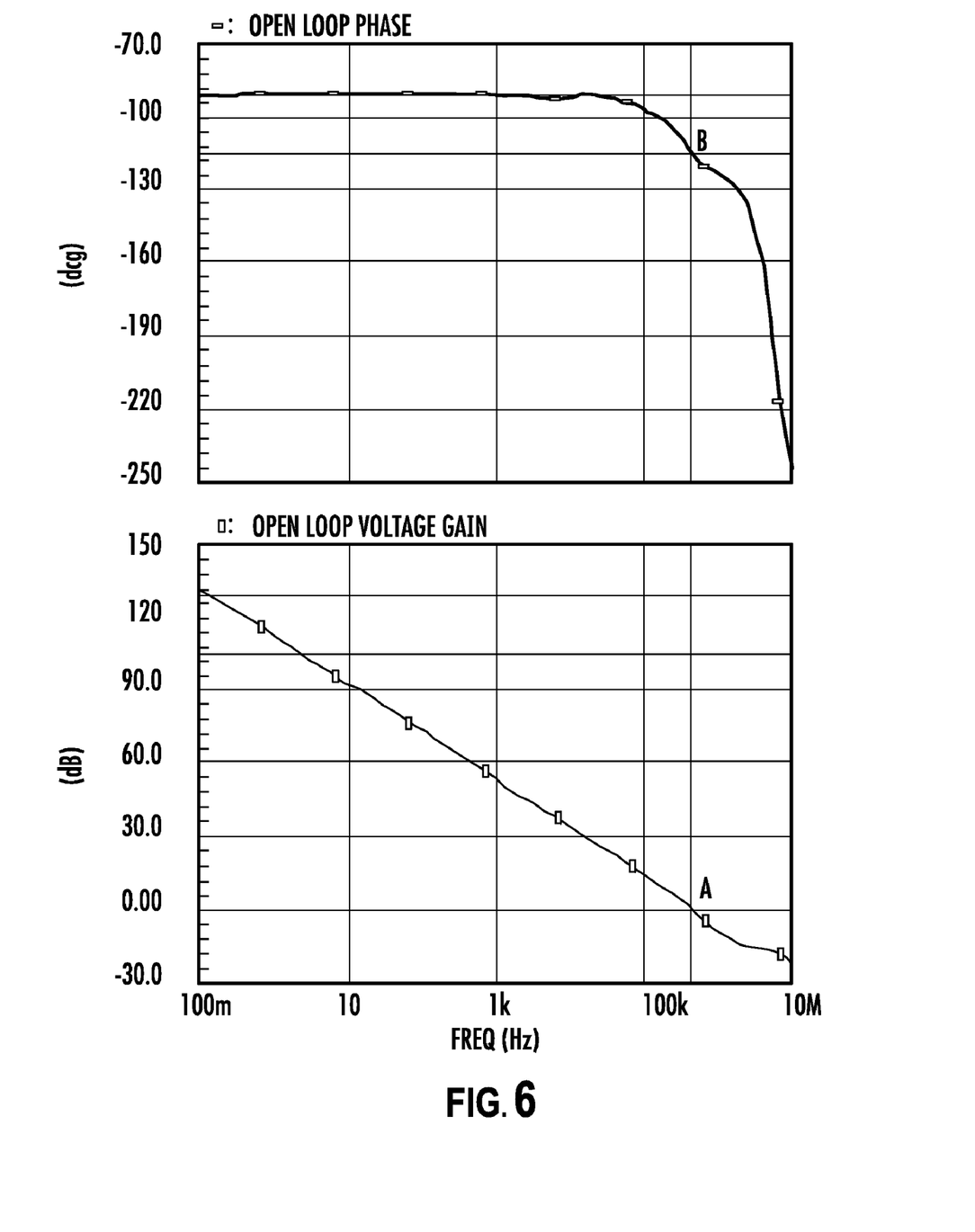
FIG. 6 shows an exemplary simulated open loop frequency response of the amplifier of FIG. 2A.

FIG. 6 shows an exemplary simulated open loop frequency response of the amplifier 200 of FIG. 2A. More specifically, FIG. 6 shows that the 6 dB/octave frequency response and 90 degree phase shift of the amplifier 200 is unchanged.

While useful in many different applications, the amplifier 200 may be especially useful in precision analog signal processing, battery management, temperature sensing, strain sensing (e.g., for use in a digital scale), but is not limited thereto. The amplifier 200 can be used as an operational amplifier, or as an instrumentation amplifier, but is not limited thereto.

The amplifier 200 provides excellent DC performance, by applying chopper stabilization to the input amplifier stage Gm1 that determines the input offset and input offset drift performance of the circuit. The chopper stabilization generates chopper frequency ripple (also referred to as chopping frequency ripple) inside the circuit at the chopping frequency, that are filtered out by the filter 222 and the buffer A1 in a manner that does not disturb that amplitude and phase response of the amplifier 200. Accordingly, the amplifier 200 provides for high accuracy, yet behaves in a similar manner as a standard operational amplifier, so that an end customer does not have to use unconventional design techniques and/or extra circuitry when utilizing the amplifier 200 as an operational amplifier.

Figure 7:
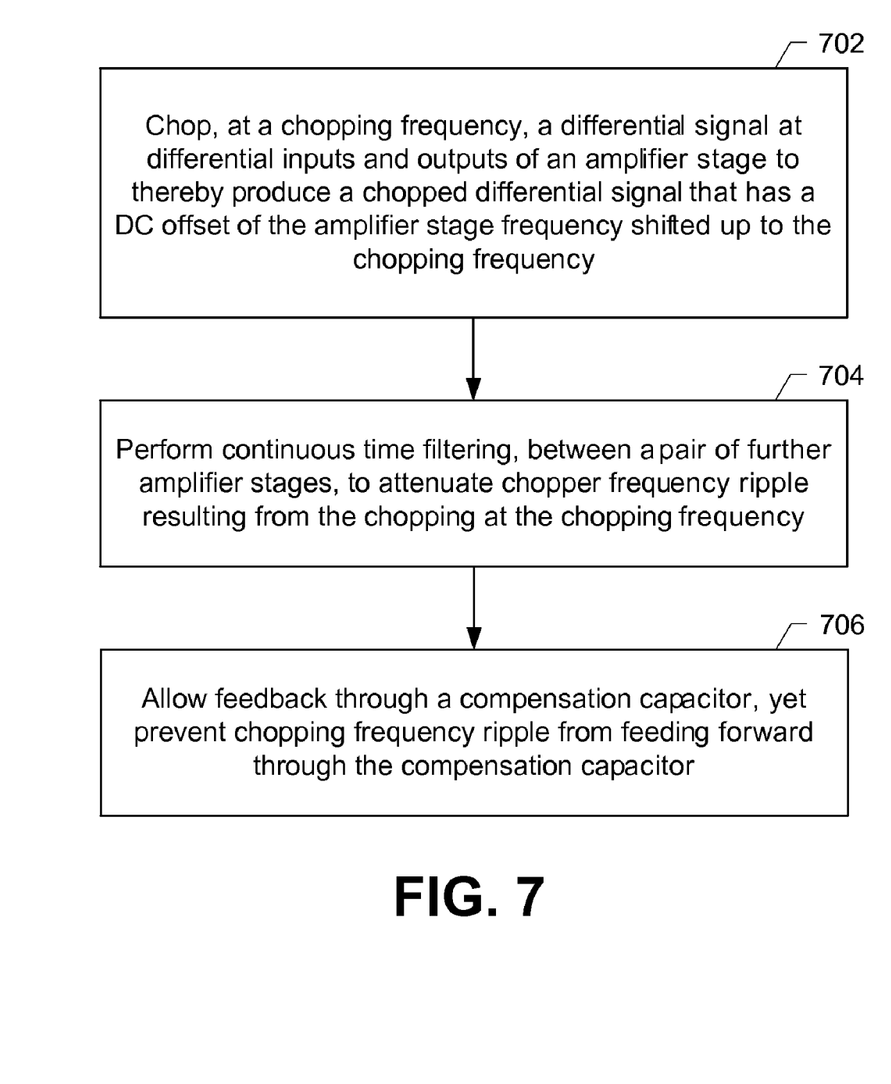
FIG. 7 is a high level flow diagram used to summarize methods of embodiments of the present invention.

The high level flow diagram of FIG. 7 is used to summarize methods of embodiments of the present invention, which can be used with an amplifier having differential inputs, an output, and a low frequency path and a high frequency path from the differential inputs to the output. Referring to FIG. 7, at step 702, chopping occurs, at a chopping frequency, of a differential signal at differential inputs and outputs of an amplifier stage (of the low frequency path) to thereby produce a chopped differential signal that has a DC offset of the amplifier stage frequency shifted up to the chopping frequency. At step 704, continuous time filtering is performed, between a pair of further amplifier stages (of the low frequency path), to attenuate chopper frequency ripple resulting from the chopping at the chopping frequency. As explained above, the continuous time filtering can be performed by a continuous time notch filter, or alternatively a continuous time low pass filter. Still referring to FIG. 7, as specified at step 706, feedback (for the low frequency path) is allowed through a compensation capacitor (e.g., C1a), while preventing chopper frequency ripple from feeding forward through the compensation capacitor (e.g., C1a). As explained above, a buffer (e.g., A1) can be used to achieve step 706. Additional details of methods of embodiments of the present invention will be understood from the above description of the amplifier 200.

Embodiments of the present invention have been described above with the aid of functional building blocks illustrating the performance of specified functions and relationships thereof. The boundaries of these functional building blocks have often been arbitrarily defined herein for the convenience of the description. Alternate boundaries can be defined so long as the specified functions and relationships thereof are appropriately performed. Any such alternate boundaries are thus within the scope and spirit of the invention.

The forgoing description is of the preferred embodiments of the present invention. These embodiments have been provided for the purposes of illustration and description, but are not intended to be exhaustive or to limit the invention to the precise forms disclosed. Many modifications and variations will be apparent to a practitioner skilled in the art, and are within the scope of the present invention.

Embodiments were chosen and described in order to best describe the principles of the invention and its practical application, thereby enabling others skilled in the art to understand the invention. It is intended that the scope of the invention be defined by the following claims and their equivalents.

What is claimed:

1. An amplifier including an inverting input, a non-inverting input, and an output, the amplifier comprising:
   a first amplifier stage including differential inputs and complimentary differential outputs;
   a first chopper connected between the inverting and non-inverting inputs of the amplifier and the differential inputs of the first amplifier stage;
   a second amplifier stage including differential inputs and an output;
   a second chopper connected between the complimentary differential outputs of the first amplifier stage and the differential inputs of the second amplifier stage;
   a third amplifier stage including differential inputs and an output; and
   a continuous time filter configured to attenuate chopper frequency ripple produced by the first and second choppers;
   wherein the output of the third amplifier stage is connected to the output of the amplifier, directly, or through one or more further amplifier stage.

2. The amplifier of claim 1, further comprising:
   a buffer including an input and an output, the input of the buffer connected to the output of the amplifier; and
   a compensation capacitor connected between the non-inverting one of the differential inputs of the second amplifier stage and the output of the buffer;
   wherein the buffer allows feedback through the compensation capacitor, yet prevents chopper frequency ripple from feeding forward to the output of the amplifier through the compensation capacitor.

3. The amplifier of claim 2, wherein the buffer is a rail-to-rail unity gain buffer.

4. The amplifier of claim 2, further comprising:
   a further capacitor connected between the inverting one of the differential inputs of the second amplifier stage and ground.

5. The amplifier of claim 1, further comprising:
   a compensation capacitor connected between the non-inverting one of the differential inputs of the second amplifier stage and the output of the amplifier.

6. The amplifier of claim 5, further comprising:
   a further capacitor connected between the inverting one of the differential inputs of the second amplifier stage and ground.

7. The amplifier of claim 1, wherein the continuous time filter comprises a notch filter.

8. The amplifier of claim 7, wherein the continuous time notch filter comprises a twin-T notch filter.

9. The amplifier of claim 1, wherein the continuous time filter comprises a low pass filter.

10. The amplifier of claim 1, further comprising:
    a fourth amplifier stage including differential inputs and an output, the differential inputs of the fourth amplifier stage connected to the inverting and non-inverting inputs of the amplifier, the output of the fourth amplifier stage connected to the output of the third amplifier stage.

11. The amplifier of claim 10, further comprising:
    a fifth amplifier stage including an input and an output, the input of the fifth amplifier stage connected to the output of the third amplifier stage and to the output of the fourth amplifier stage, and the output of the fifth amplifier stage connected to the output of the amplifier, directly, or through one or more further amplifier stage.

12. The amplifier of claim 11, further comprising:

a backward nesting capacitor connected between the input and the output of the fifth amplifier stage.

13. The amplifier of claim 10, wherein:

the first, second and third amplifier stages provide at least part of a low frequency path from the inputs to the output of the amplifier; and the fourth amplifier stage provides at least part of a high frequency path from the inputs to the output of the amplifier.

14. An amplifier including differential inputs, and an output, the amplifier comprising:

a low frequency path between the differential inputs and the output of the amplifier;

a high frequency path between the differential inputs and the output of the amplifier;

the low frequency path including a plurality of amplifier stages;

choppers within the low frequency path that chop, at a chopping frequency, a differential signal at differential inputs and outputs of one of the amplifiers of the low frequency path to produce a chopped differential signal that has a DC offset of the one of the amplifier stages frequency shifted up to the chopping frequency; and a continuous time filter within the low frequency path, after the choppers, to attenuate chopper frequency ripple resulting from the chopping at the chopping frequency.

15. The amplifier of claim 14, further comprising:

a buffer including an input and an output, the input of the buffer connected to the output of the amplifier; and a compensation capacitor connected between the output of the buffer and a node within the low frequency path;

wherein the buffer allows feedback through the compensation capacitor, yet prevents chopper frequency ripple from feeding forward to the output of the amplifier through the compensation capacitor.

16. A method for use within an amplifier, comprising:

chopping, at a chopping frequency, a differential signal at differential inputs and outputs of a first amplifier stage to thereby produce a chopped differential signal that has a DC offset of the first amplifier stage frequency shifted up to the chopping frequency; and performing continuous time filtering, between a pair of further amplifier stages other than the first amplifier stage, to attenuate chopper frequency ripple resulting from the chopping at the chopping frequency.

17. A method for use within an amplifier, comprising:

chopping, at a chopping frequency, a differential signal at differential inputs and outputs of an amplifier stage to thereby produce a chopped differential signal that has a DC offset of the amplifier stage frequency shifted up to the chopping frequency;

performing continuous time filtering, between a pair of further amplifier stages, to attenuate chopper frequency ripple resulting from the chopping at the chopping frequency; and allowing feedback through a compensation capacitor, yet preventing chopper frequency ripple from feeding forward through the compensation capacitor.

18. The method of claim 17, using a buffer to allow the feedback through the compensation capacitor, yet prevent chopper frequency ripple from feeding forward through the compensation capacitor.

19. A method for use within an amplifier, comprising:

chopping, at a chopping frequency, a differential signal at differential inputs and outputs of an amplifier stage to thereby produce a chopped differential signal that has a DC offset of the amplifier stage frequency shifted up to the chopping frequency; and performing continuous time filtering, between a pair of further amplifier stages, to attenuate chopper frequency ripple resulting from the chopping at the chopping frequency;

wherein the amplifier includes differential inputs, an output, and a low frequency path and a high frequency path from the differential inputs to the output, and wherein the chopping, at the chopping frequency, occurs within the low frequency path.

20. The method of claim 19, further comprising:

allowing feedback for the low frequency path through a compensation capacitor, yet preventing chopper frequency ripple from feeding forward through the compensation capacitor to the output of the amplifier.

21. The method of claim 20, using a buffer to allow the feedback through the compensation capacitor, yet prevent chopper frequency ripple from feeding forward through the compensation capacitor to the output of the amplifier.

22. The method of claim 16, wherein the continuous time filtering is performed using a continuous time notch filter or a continuous time low pass filter.

23. An amplifier including differential inputs, and an output, the amplifier comprising:

a low frequency path between the differential inputs and the output of the amplifier;

a high frequency path between the differential inputs and the output of the amplifier;

the low frequency path including a plurality of amplifier stages;

choppers within the low frequency path that chop, at a chopping frequency, a differential signal at differential inputs and outputs of one of the amplifiers of the low frequency path to produce a chopped differential signal that has a DC offset of the one of the amplifier stages frequency shifted up to the chopping frequency;

a filter within the low frequency path, after the choppers, to attenuate chopper frequency ripple resulting from the chopping at the chopping frequency;

a buffer including an input and an output, the input of the buffer connected to the output of the amplifier; and a compensation capacitor connected between the output of the buffer and a node within the low frequency path;

wherein the buffer allows feedback through the compensation capacitor, yet prevents chopper frequency ripple from feeding forward to the output of the amplifier through the compensation capacitor.

24. The amplifier of claim 23, wherein the filter comprises a continuous time notch filter or a continuation time low pass filter.

25. The amplifier of claim 1, wherein the continuation time filter comprises a three terminal continuous time filter including:

a first terminal connected to the output of the second amplifier stage;

a second terminal connected to a non-inverting one of the differential inputs of the third amplifier stage; and a third terminal connected to the inverting one of the differential inputs of the second amplifier stage, and to the inverting one of the differential inputs of the third amplifier stage;

wherein the output of the third amplifier stage is connected to the output of the amplifier, directly, or through one or more further amplifier stage.

26. The amplifier of claim 25, wherein the three terminal continuous time filter comprises a notch filter.

27. The amplifier of claim 26, wherein the three terminal continuous time notch filter comprises a twin-T notch filter.

28. The amplifier of claim 25, wherein the three terminal continuous time filter comprises a low pass filter.

29. The amplifier of claim 16, wherein the continuous time filtering is performed using a continuous time notch filter.

* * * * *